(12) United States Patent
Yamada et al.

(10) Patent No.: US 10,654,708 B2
(45) Date of Patent: May 19, 2020

(54) OPTICAL SCANNER MODULE AND OPTICAL SCANNER CONTROL APPARATUS

(71) Applicants: MITSUMI ELECTRIC CO., LTD., Tokyo (JP); Tsukasa Yamada, Tokyo (JP); Takahiro Wakasugi, Tokyo (JP); Shinobu Kasahara, Tokyo (JP)

(72) Inventors: Tsukasa Yamada, Tokyo (JP); Takahiro Wakasugi, Tokyo (JP); Shinobu Kasahara, Tokyo (JP)

(73) Assignee: MITSUMI ELECTRIC CO., LTD., Tokyo (JP)

(*) Notice: Subject to any disclaimer, the term of this patent is extended or adjusted under 35 U.S.C. 154(b) by 0 days.

(21) Appl. No.: 15/763,921

(22) PCT Filed: Nov. 18, 2016

(86) PCT No.: PCT/IB2016/001637
§ 371 (c)(1),
(2) Date: Mar. 28, 2018

(87) PCT Pub. No.: WO2017/055931
PCT Pub. Date: Apr. 6, 2017

(65) Prior Publication Data
US 2018/0290881 A1  Oct. 11, 2018

(30) Foreign Application Priority Data
Oct. 2, 2015  (JP) ................. 2015-196872

(51) Int. Cl.
*B81B 7/00* (2006.01)
*G02B 26/10* (2006.01)
(Continued)

(52) U.S. Cl.
CPC .............. *B81B 7/0006* (2013.01); *B81B 7/02* (2013.01); *G02B 26/08* (2013.01);
(Continued)

(58) Field of Classification Search
CPC ..... B81B 7/0006; B81B 7/02; B81B 2207/07; B81B 2207/098; B81B 2201/042;
(Continued)

(56) References Cited

U.S. PATENT DOCUMENTS 5,657,242 A     8/1997  Sekiyama et al.
2001/0017418 A1  8/2001  Noguchi et al.
(Continued)

FOREIGN PATENT DOCUMENTS

CN     102630118    8/2012
CN     103033928    4/2013
(Continued)

OTHER PUBLICATIONS

International Search Report for PCT/IB2016/001637 dated Feb. 21, 2017.
(Continued)

*Primary Examiner* — Jennifer D. Carruth
(74) *Attorney, Agent, or Firm* — IPUSA, PLLC

(57) ABSTRACT

The present invention is to provide an optical scanner module capable of reducing cross-talk generated between a sensor interconnect and a drive interconnect. An optical scanner module, includes an optical scanner apparatus that scans incident light by oscillating a mirror; and a package on which the optical scanner apparatus is mounted, wherein the optical scanner apparatus includes a displacement sensor that detects an oscillation angle of the mirror, wherein a sensor interconnect ($P_S$) connected to the displacement sensor and a drive interconnect through which a drive signal for oscillating the mirror passes are respectively drawn from the optical scanner apparatus into the package, wherein interconnect layers (L1, L2) in which the sensor interconnect and the drive interconnect ($P_D$) are formed are stacked, wherein the sensor interconnect and the drive interconnect (Continued)

are placed not to overlap in a plan view of the interconnect layers, and wherein a GND interconnect ($P_G$) is provided between the sensor interconnect and the drive interconnect that are adjacent in a same interconnect layer.

7 Claims, 13 Drawing Sheets

(51) Int. Cl.
*B81B 7/02* (2006.01)
*G02B 26/08* (2006.01)

(52) U.S. Cl.
CPC ......... *G02B 26/0858* (2013.01); *G02B 26/10* (2013.01); *B81B 2201/042* (2013.01); *B81B 2207/07* (2013.01); *B81B 2207/098* (2013.01)

(58) Field of Classification Search
CPC . B81B 3/0083; B81B 3/0086; B81B 2203/04; G02B 26/0858; G02B 26/08; G02B 26/10; G02B 26/0841; G02B 26/085; G02B 26/033; G02B 26/101; G02B 26/105
See application file for complete search history.

(56) References Cited

U.S. PATENT DOCUMENTS

| | | |
|---|---|---|
| 2003/0173654 A1 | 9/2003 | Rodgers et al. |
| 2005/0014307 A1 | 1/2005 | Shiraishi et al. |
| 2006/0139713 A1 | 6/2006 | Yee et al. |
| 2011/0292479 A1* | 12/2011 | Hiraoka ............. G02B 26/0858 359/199.1 |
| 2012/0201087 A1 | 8/2012 | Mizuno et al. |
| 2013/0083378 A1 | 4/2013 | Tanaka et al. |
| 2014/0192061 A1* | 7/2014 | Payne ................. G06T 1/00 345/501 |
| 2014/0232241 A1* | 8/2014 | Hajati ..................... B81B 7/008 310/317 |
| 2014/0355087 A1 | 12/2014 | Hibiya et al. |
| 2016/0131895 A1 | 5/2016 | Kurozuka et al. |

FOREIGN PATENT DOCUMENTS

| | | |
|---|---|---|
| EP | 0552935 | 7/1993 |
| EP | 2808719 | 12/2014 |
| JP | S59-214241 | 12/1984 |
| JP | H05-205011 | 8/1993 |
| JP | 2001-244267 | 9/2001 |
| JP | 2004-235542 | 8/2004 |
| JP | 2005-039152 | 2/2005 |
| JP | 2005-244032 | 9/2005 |
| JP | 2006-184905 | 7/2006 |
| JP | 2012-164794 | 8/2012 |
| JP | 2013-083769 | 5/2013 |
| JP | 2013-092750 | 5/2013 |
| JP | 2014-126715 | 7/2014 |
| JP | 2014-235316 | 12/2014 |
| WO | 2015/136830 | 9/2015 |

OTHER PUBLICATIONS

Extended European search report for European Patent Application No. 16850458.7 dated Jan. 31, 2019.
Japanese Office Action for 2015-196872 dated Aug. 6, 2019.
Japanese Office Action for 2018-156402 dated Aug. 6, 2019.
Japanese Office Action for 2015-196872 dated Jan. 28, 2020.
Japanese Office Action for 2018-156402 dated Jan. 28, 2020.
Chinese Office Action for 201680057946.9 dated Dec. 11, 2019.

* cited by examiner

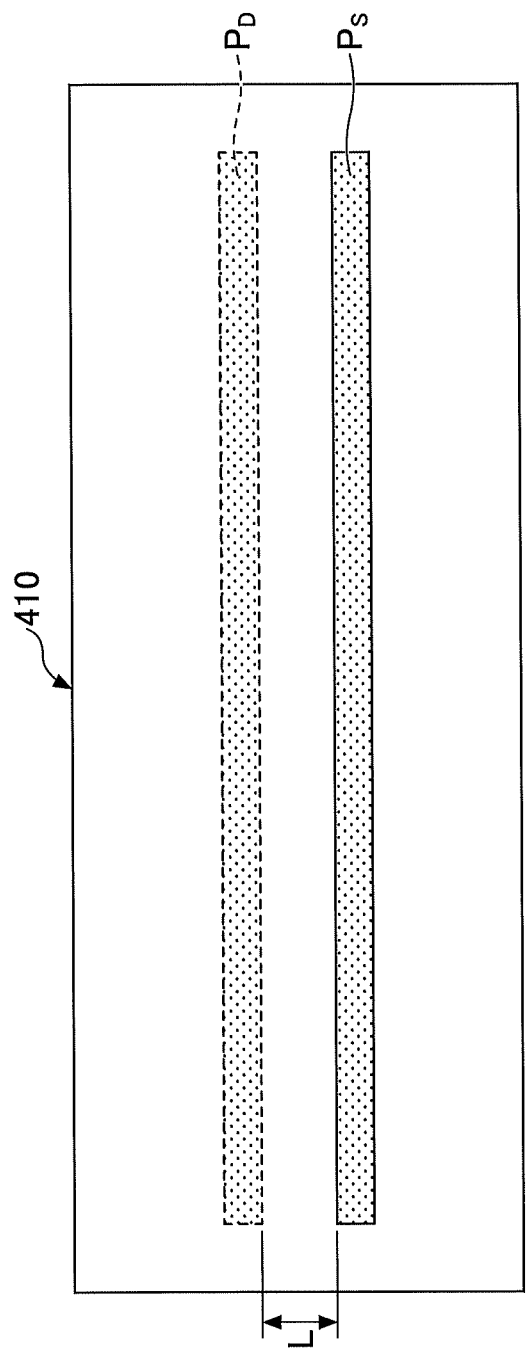

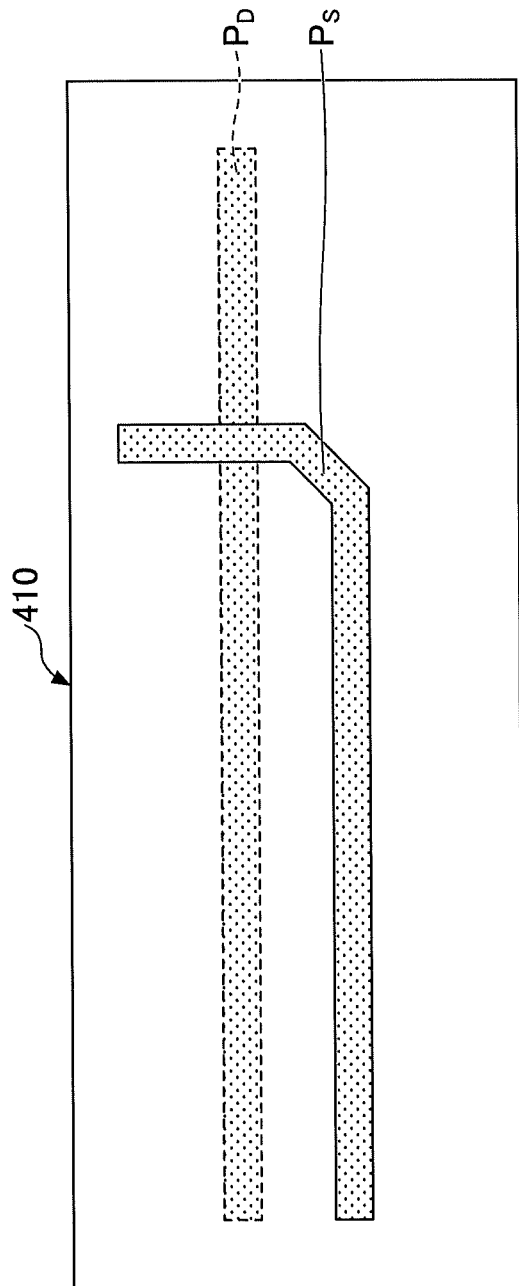

OPTICAL SCANNER MODULE AND OPTICAL SCANNER CONTROL APPARATUS

BACKGROUND OF THE INVENTION

1. Field of the Invention

The present invention relates to an optical scanner module and an optical scanner control apparatus.

2. Description of the Related Art

Conventionally, an optical scanner module is known in which an optical scanner apparatus that rotates a mirror around a rotation axis to reflect incident light such as laser light is mounted on a package. In this optical scanner module, a displacement sensor that detects an oscillation angle of the mirror under a status that the mirror is driven and oscillated is provided, inclination of the mirror is detected based on a signal output from the displacement sensor, and the mirror is controlled to be driven (see Patent Document 1, for example).

PATENT DOCUMENT

[Patent Document 1] Japanese Laid-open Patent Publication No. 2014-235316

However, a sensor interconnect connected to the displacement sensor and a drive interconnect through which a drive signal for oscillating the mirror passes may be drawn in the package in a complicated manner in the above described optical scanner module. Then, depending on a way of drawing the interconnects, cross-talk may be generated between the sensor interconnect and the drive interconnect, and there is a risk that a signal from the sensor interconnect cannot be accurately detected.

SUMMARY OF THE INVENTION

The present invention is made in light of the above problems, and provides an optical scanner module capable of reducing cross-talk generated between a sensor interconnect and a drive interconnect.

An optical scanner module (400), includes an optical scanner apparatus (30) that scans incident light by oscillating a mirror (310); and a package (410) on which the optical scanner apparatus (30) is mounted, wherein the optical scanner apparatus (30) includes a displacement sensor (391, 395, 396) that detects an oscillation angle of the mirror (310), wherein a sensor interconnect ($P_S$) connected to the displacement sensor (391, 395, 396) and a drive interconnect ($P_D$) through which a drive signal for oscillating the mirror (310) passes are respectively drawn from the optical scanner apparatus (30) into the package (410), wherein interconnect layers in which the sensor interconnect ($P_S$) and the drive interconnect ($P_D$) are formed are stacked, wherein the sensor interconnect ($P_S$) and the drive interconnect ($P_D$) are placed not to overlap in a plan view of the interconnect layers, and wherein a GND interconnect ($P_G$) is provided between the sensor interconnect ($P_S$) and the drive interconnect ($P_D$) that are adjacent in a same interconnect layer.

Here, the reference numerals in the brackets are provided for facilitating understanding and just an example, and the components are not limited to the illustrated embodiments.

According to the disclosed technique, an optical scanner module capable of reducing cross-talk generated between a sensor interconnect and a drive interconnect can be provided.

BRIEF DESCRIPTION OF THE DRAWINGS

FIG. 5A is a view (No. 2) for describing a method of suppressing cross-talk;

FIG. 5B is a view (No. 3) for describing a method of suppressing cross-talk;

BRIEF DESCRIPTION OF THE DRAWINGS

Figure 1:
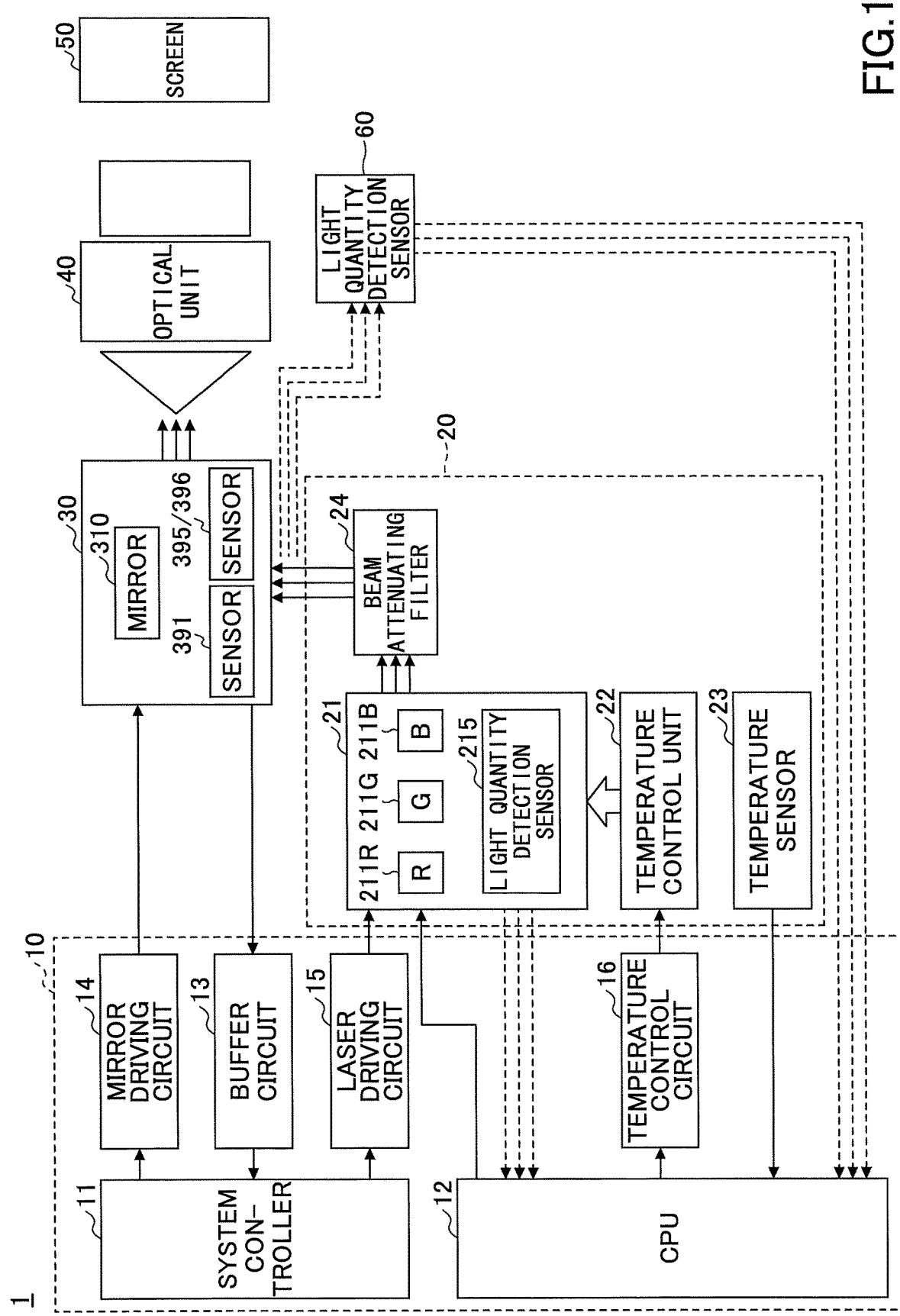
FIG. 1 is a block diagram illustrating an example of an optical scanner control apparatus of a first embodiment.

Embodiments of the invention will be described herein with reference to drawings. It is to be noted that, in each of the drawings, the same components are given the same reference numerals, and explanations may not be repeated.

(First Embodiment)

Figure 2:
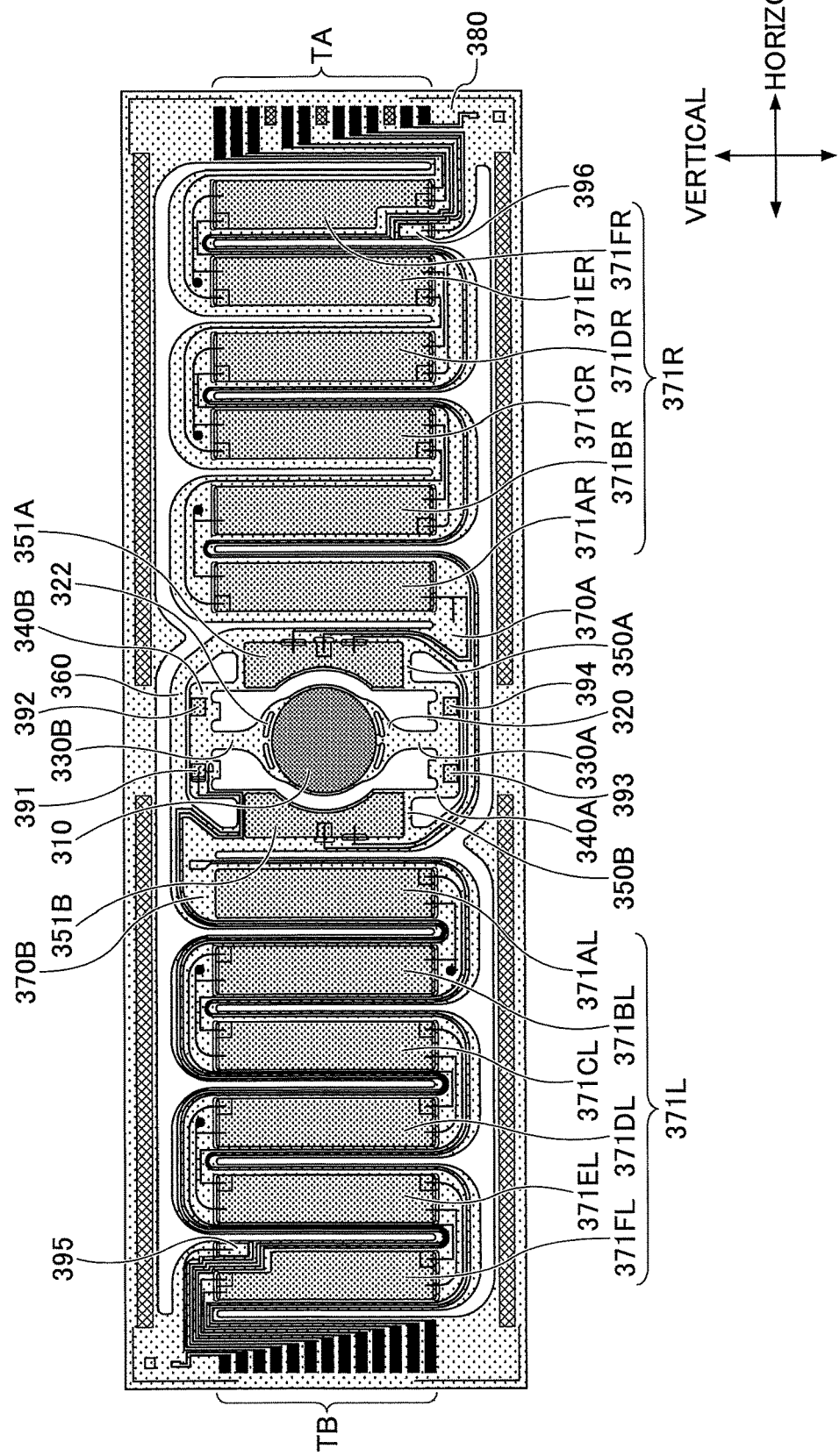
FIG. 2 is a plan view illustrating an example of an optical scanner apparatus constituting the optical scanner control apparatus.

FIG. 1 is a block diagram illustrating an example of an optical scanner control apparatus of a first embodiment. FIG. 2 is a plan view illustrating an example of an optical scanner apparatus that constitutes the optical scanner control apparatus.

(Schematic Structure of Optical Scanner Control Apparatus)

First, with reference to FIG. 1 and FIG. 2, a schematic structure of an optical scanner control apparatus 1 is described. The optical scanner control apparatus 1 includes, as main constituents, a circuit unit 10, a light source unit 20, an optical scanner apparatus 30, an optical unit 40, a screen 50 and a light quantity detection sensor 60. The optical scanner control apparatus 1 is, for example, a laser scanning projector.

The circuit unit 10 is a portion that controls the light source unit 20 and the optical scanner apparatus 30, and may be constituted by, for example, a system controller 11, a CPU (Central Processing Unit) 12, various driving circuits such as a buffer circuit 13, a mirror driving circuit 14, a laser driving circuit 15 and a temperature control circuit 16, and the like.

The light source unit 20 includes an LD module 21, a temperature control unit 22, a temperature sensor 23 and a beam attenuating filter 24.

The LD module 21 includes lasers 211R, 211G and 211B each of whose output light quantity is changed in accordance with a current value, a light quantity detection sensor 215 that monitors the latest light quantity of each of the lasers 211R, 211G and 211B, and the like. The laser 211R may be a red semiconductor laser and may output light with wavelength λR (640 nm, for example), for example. The laser 211G may be a green semiconductor laser and may output light with wavelength λG (530 nm, for example), for example. The laser 211B may be a blue semiconductor laser and may output light with wavelength λB (445 nm, for example), for example. As the light quantity detection sensor 215, for example, a photodiode or the like may be used. The light quantity detection sensor 215 may be placed at an appropriate position at which the light quantity before passing the beam attenuating filter 24 can be detected.

The temperature control unit 22 may control the lasers 211R, 211G and 211B to be predetermined temperatures, respectively. The temperature sensor 23 may detect temperature of each of the lasers 211R, 211G and 211B. As the temperature control unit 22, for example, a Peltier element may be used. As the temperature sensor 23, for example, a thermistor may be used.

The beam attenuating filter 24 is placed at a preceding stage of a mirror 310, and light (synthesized light) output from the lasers 211R, 211G and 211B is input. The beam attenuating filter 24 has a function to adjust brightness on the screen 50. As the beam attenuating filter 24, an ND (Neutral Density) filter, a liquid crystal device (liquid crystal element), a polarizing filter or the like may be used. The beam attenuating filter 24 is, for example, inserted to be inclined with respect to an optical axis of incident light, and light that does not pass (attenuated light) is absorbed or reflected by the beam attenuating filter 24.

The optical scanner apparatus 30 is, for example, a MEMS (Micro Electro Mechanical System) that drives the mirror 310 by a piezo-electric element. The mirror 310 functions as scanning means that forms an image on the screen 50 by reflecting light (synthesized light) output from the lasers 211R, 211G and 211B, and two-dimensionally scanning the incident light in a horizontal direction and in a vertical direction in accordance with an image signal.

Specifically, as illustrated in FIG. 2, the optical scanner apparatus 30 includes the mirror 310, a mirror support portion 320, torsion beams 330A and 330B, connecting beams 340A and 340B, driving beams 350A and 350B, a movable frame 360, driving beams 370A and 370B and a fixed frame 380. The driving beams 350A and 350B respectively include driving sources 351A and 351B. The driving beams 370A and 370B respectively include driving sources 371R and 371L. The driving beams 350A and 350B and the driving beams 370A and 370B function as actuators that scan laser light by oscillating the mirror 310 in upper-lower or left-right directions.

The mirror support portion 320 is provided with slits 322 along a circumference of the mirror 310. By providing the slits 322, the mirror support portion 320 can be lightened and stress that is generated when transmitting torsion by the torsion beams 330A and 330B to the mirror 310 can be reduced.

In the optical scanner apparatus 30, the mirror 310 is supported at a front surface of the mirror support portion 320, and the mirror support portion 320 is connected to end portions of the torsion beams 330A and 330B that are provided at both sides of the mirror support portion 320. The torsion beams 330A and 330B form an oscillating axis, and supports the mirror support portion 320 from both sides in an axial direction by extending in the axial direction. When the torsion beams 330A and 330B are distorted, the mirror 310 supported by the mirror support portion 320 is oscillated so that reflected light irradiated on the mirror 310 is scanned. The torsion beams 330A and 330B are connected to be supported by the connecting beams 340A and 340B, and further connected to the driving beams 350A and 350B, respectively.

The driving beams 350A and 350B, the connecting beams 340A and 340B, the torsion beams 330A and 330B, the mirror support portion 320 and the mirror 310 are surrounded by the movable frame 360. One side of each of the driving beams 350A and 350B is supported by the movable frame 360. The other side of the driving beam 350A extends an inner side to be connected to the connecting beams 340A and 340B. The other side of the driving beam 350B similarly extends an inner side to be connected to the connecting beams 340A and 340B.

The driving beams 350A and 350B are provided as a pair in a direction perpendicular to the torsion beams 330A and 330B such that to interpose the mirror 310 and the mirror support portion 320 therebetween. The driving sources 351A and 351B are provided at front surfaces of the driving beams 350A and 350B, respectively. The driving sources 351A and 351B are piezo-electric elements each having a structure in which a lower electrode, a piezo-electric film (a PZT film or the like) and an upper electrode are stacked in this order on the surfaces of the driving beams 350A and 350B, respectively. Each of the driving sources 351A and 351B extends or shrinks in accordance with polar of the drive voltage that is applied to the upper electrode and the lower electrode.

Thus, by alternately applying drive voltages of different phases to the driving beam 350A and the driving beam 350B, respectively, the driving beam 350A and the driving beam 350B alternately oscillate opposite directions (upper or lower) at left-right sides of the mirror 310. With this, the mirror 310 can be oscillated around an axis while having the torsion beams 330A and 330B as an oscillating axis or a rotation axis. Hereinafter, a direction in which the mirror 310 is oscillated around the axis of the torsion beams 330A and 330B is referred to as a "horizontal direction". For example, a resonance frequency is used for horizontal driving by the driving beams 350A and 350B, and it is possible to drive the mirror 310 to be oscillated at a high speed.

As such, the driving beams 350A and 350B are horizontal driving beams including horizontal driving sources 351A and 351B that oscillate the mirror 310 in the horizontal direction, respectively.

One end of each of the driving beams 370A and 370B is connected to an outer side of the movable frame 360. The driving beams 370A and 370B are connected to the movable frame 360 at positions that are point symmetry with respect to the mirror 310 as a center, and are provided as a pair to interpose the movable frame 360 therebetween from left-right sides, respectively. The driving beam 370A includes multiple beams each extending in parallel with respect to the driving beam 350A where adjacent beams are connected with each other at respective end portions to form a zig-zag shape as a whole. The other end of the driving beam 370A is connected to an inner side of the fixed frame 380. The driving beam 370B includes, similarly, multiple beams each extending in parallel with respect to the driving beam 350B where adjacent beams are connected with each other at respective end portions to form a zig-zag shape as a whole. The other end of the driving beam 370B is connected to an inner side of the fixed frame 380.

The driving sources 371R and 371L are formed on front surfaces of each of the rectangular beams, not including curbed portions, of the driving beams 370A and 370B, respectively. The driving sources 371R and 371L are piezo-electric elements each having a structure in which a lower electrode, a piezo-electric film and an upper electrode are stacked in this order on the surfaces of the driving beams 370A and 370B, respectively.

In the driving beams 370A and 370B, by applying driving voltages of different polarities to the adjacent driving sources 371R and 371L of the adjacent rectangular beams, the adjacent rectangular beams are warped in the opposite directions in the upper and lower direction. Thus, the accumulated movement of the rectangular beams in the upper and lower direction is transmitted to the movable frame 360. The driving beams 370A and 370B oscillate the mirror 310 in the vertical direction, which is perpendicular to the horizontal direction by this operation. For example, for the vertical driving by the driving beams 370A and 370B, a non-resonance frequency may be used.

For example, the driving source 371R includes driving sources 371AR, 371BR, 371CR, 371DR, 371ER and 371FR that are aligned rightward from a movable frame 360 side. The driving source 371L includes driving sources 371AL, 371BL, 371CL, 371DL, 371EL and 371FL that are aligned leftward from a movable frame 360 side. In such a case, by driving the driving sources 371AR, 371BL, 371CR, 371DL, 371ER and 371FL by the same waveform, and the driving sources 371BR, 371AL, 371DR, 371CL, 371FR and 371EL by the waveform with different phase from that for the driving sources 371AR, 371BL, 371CR, 371DL, 371ER and 371FL, the mirror 310 can be oscillated in the vertical direction.

As such, the driving beams 370A and 370B are vertical driving beams including vertical driving sources 371R and 371L that oscillate the mirror 310 in the vertical direction, respectively.

Drive interconnects that apply drive voltage to the upper electrode and the lower electrode of the driving source 351A are connected to predetermined terminals of a group of terminals TA provided at the fixed frame 380. Drive interconnects that apply drive voltage to the upper electrode and the lower electrode of the driving source 351B are connected to predetermined terminals of a group of terminals TB provided at the fixed frame 380. Drive interconnects that apply drive voltage to the upper electrode and the lower electrode of the driving source 371R are connected to predetermined terminals of the group of terminals TA provided at the fixed frame 380. Drive interconnects that apply drive voltage to the upper electrode and the lower electrode of the driving source 371L are connected to predetermined terminals of the group of terminals TB provided at the fixed frame 380.

The optical scanner apparatus 30 includes a horizontal displacement sensor 391 that detects inclination (oscillation angle in the horizontal direction) of the mirror 310 in the horizontal direction when the drive voltage is applied to the driving sources 351A and 351B and the mirror 310 is oscillated in the horizontal direction. Numerals "392", "393" and "394" are dummy sensors.

The optical scanner apparatus 30 includes vertical displacement sensors 395 and 396 that detect inclination (oscillation angle in the vertical direction) of the mirror 310 in the vertical direction when the voltage is applied to the driving sources 371R and 371L and the mirror 310 is oscillated in the vertical direction.

Referring back to FIG. 1, the optical unit 40 is an optical system that projects light scanned by the optical scanner apparatus 30 on the screen 50. The light input in the optical unit 40 from the optical scanner apparatus 30 forms an image on the screen 50, and an image corresponding to the image signal is displayed on the screen 50.

The screen 50 includes, for example, a micro-lens array for removing noises of an image that are seen as particles called speckles. In such a case, each of the micro-lenses that compose the micro-lens array corresponds to a pixel of a display, and it is preferable that an irradiated laser beam is equal to a size of the micro-lens or less than the size of the micro-lens.

The light quantity detection sensor 60 may be placed at an appropriate position at which the quantity of the light that passes the beam attenuating filter 24 can be detected. The light quantity detection sensor 60 is capable of independently detecting the light quantity of each of the lasers 211R, 211G and 211B after passing the beam attenuating filter 24. As the light quantity detection sensor 60, for example, one or a plurality of photodiodes or the like may be used.

(Schematic Operation of Optical Scanner Control Apparatus)

Next, an operation of the optical scanner control apparatus 1 is schematically described. The system controller 11, that is a control unit, generates a drive signal based on a signal obtained via the sensor interconnect, for example. The mirror driving circuit 14 drives the mirror 310 based on the drive signal generated by the system controller 11, for example.

More specifically, the system controller 11 may control an oscillating angle of the mirror 310, for example. The system controller 11 may monitor inclination of the mirror 310 in the horizontal direction and the vertical direction obtained at the horizontal displacement sensor 391 and the vertical displacement sensors 395 and 396 via a buffer circuit 13, and supply an angle control signal to a mirror driving circuit 14, for example. Then, the mirror driving circuit 14 may supply predetermined drive signals to the driving beams 351 and 352 and the driving beams 371 and 372 based on the angle control signal from the system controller 11 to drive (scan) the mirror 310 at a predetermined angle.

Further, the system controller 11 may supply, for example, a digital image signal to a laser driving circuit 15. Then, the laser driving circuit 15 may supplies predetermined current to the lasers 211R, 211G and 211B based on the image signal from the system controller 11. With this, the lasers 211R, 211G and 211B emit lights of red, green and blue that are modulated in accordance with the image signal, respectively, and by synthesizing these lights, a color image can be formed.

The CPU 12 may monitor primitive light quantity output from each of the lasers 211R, 211G and 211B by the output of the light quantity detection sensor 215, and supply a light quantity control signal to the LD module 21, for example. Each of the lasers 211R, 211G and 211B is current controlled to output predetermined light quantity based on the light quantity control signal from the CPU 12.

Here, the light quantity detection sensor 215 may include three sensors each independently detecting the light quantity of the each of the lights output from the lasers 211R, 211G and 211B. Alternatively, the light quantity detection sensor 215 may be constituted by a single sensor. In such a case, it is possible to control the light quantity of the light out from each of the lasers 211R, 211G and 211B by causing the lasers 211R, 211G and 211B to emit light in order, and detecting by the single sensor.

Further, the CPU 12 may monitor temperatures of the lasers 211R, 211G and 211B by monitoring the output of the temperature sensor 23, and supply a temperature control signal to a temperature control circuit 16. Then, the temperature control circuit 16 supplies predetermined current to the temperature control unit 22 based on the temperature control signal from the CPU 12. With this, the temperature control unit 22 is heated or cooled, and each of the lasers is controlled to be predetermined temperature.

The light quantity detection sensor 60 detects light quantity of light after passing through the beam attenuating filter 24. As described above, the light quantity detection sensor 215 for adjusting the light quantity of each of the lasers is mounted in the LD module 21, and the light quantity detection sensor 215 detects primitive output light quantity of each of the lasers 211R, 211G and 211B (before passing through the beam attenuating filter 24). However, as an image that is actually displayed in the optical scanner control apparatus 1 is formed by light imaged on the screen 50, there may be a case that the light is not appropriately adjusted by an adjustment based on the primitive laser light quantity.

For example, as the beam attenuating filter 24 is provided on an optical path, depending on characteristics of the beam attenuating filter 24, there may be a case that an expected attenuating ratio cannot be obtained, and the light quantity after passing the beam attenuating filter 24 does not become an expected value. Further, when attenuating ratios of R/G/B of the beam attenuating filter 24 are dispersed, balance after passing through the beam attenuating filter 24 may not be retained. Further, there may be a case that characteristics of the optical scanner apparatus 30 are changed due to temperature or aged deterioration. Such problems cannot be dissolved even if the light quantity before passing through the optical scanner apparatus 30 is precisely controlled by the light quantity detection sensor 215.

Thus, in the optical scanner control apparatus 1, as light quantity detection means for detecting the light quantity after passing through the beam attenuating filter 24, a light quantity detection sensor 60, is provided. A detection result of the light quantity detection sensor 60 is input in the CPU 12, and the CPU 12 may supply a light quantity control signal for controlling a current value of each of the lasers to the LD module 21 based on the light quantity detected by the light quantity detection sensor 60.

With this, light quantity of the laser light including variation of the characteristics of the beam attenuating filter 24 can be detected. Thus, the light quantity can be accurately controlled so as to correspond to an image that is actually displayed on the screen 50. Here, the light quantity detection sensor 60 may independently detect the light quantity of each of the lasers 211R, 211G and 211B, and the CPU 12 may control the current value of each of the lasers based on the respective light quantity detected by the light quantity detection sensor 60.

(Electric Wiring of Optical Scanner Module)

Figure 3:
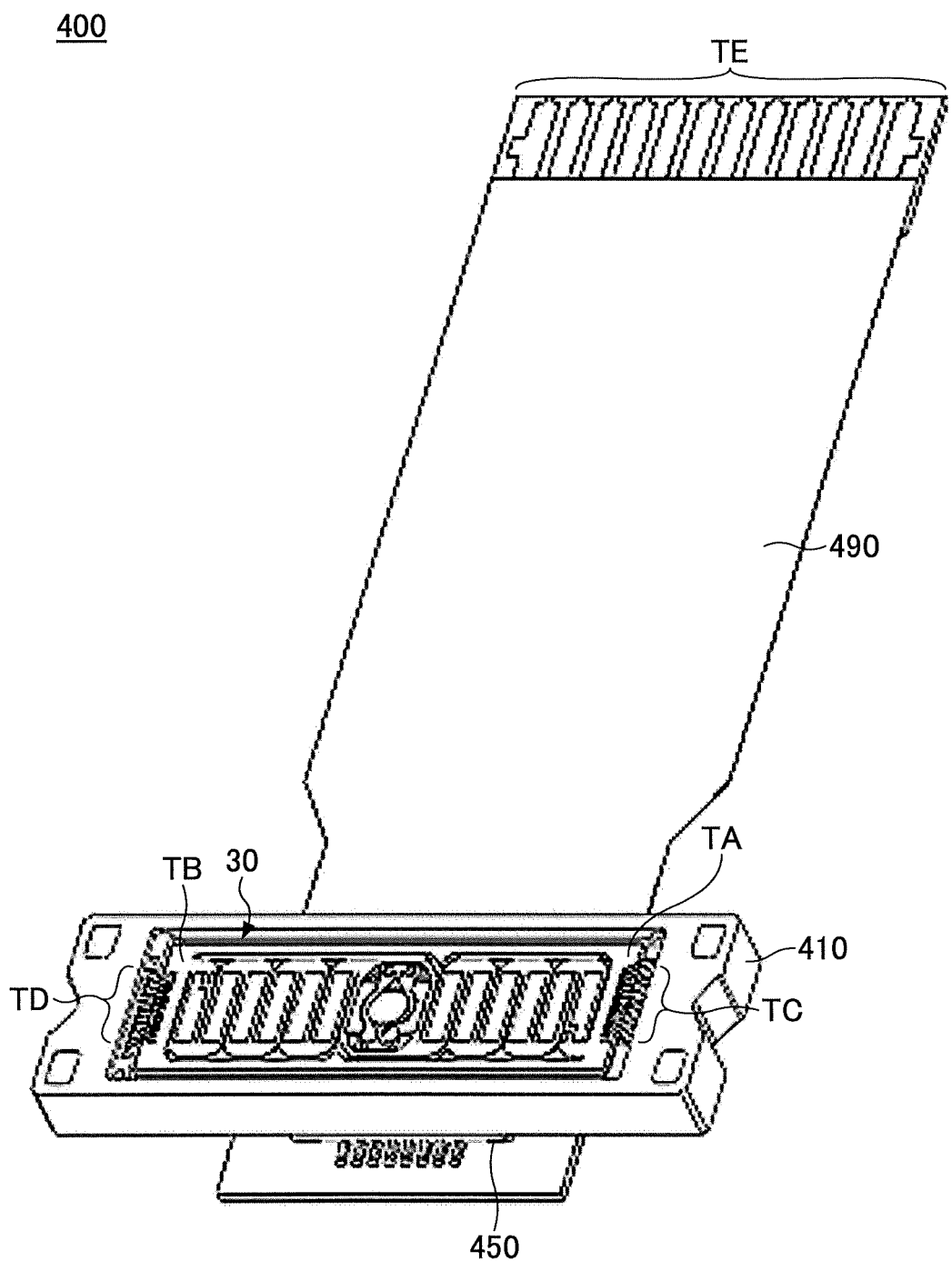
FIG. 3 is a perspective view for describing electric wiring of an optical scanner module.

FIG. 3 is a perspective view for describing electric wiring of the optical scanner module. As illustrated in FIG. 3, the optical scanner module 400 includes the optical scanner apparatus 30, a package 410, a connector 450 and a substrate 490. As will be described later, the optical scanner module 400 may include a package cover 420, a cover glass 430 and the like (see FIG. 8 and the like).

In the optical scanner module 400, the optical scanner apparatus 30 is mounted on the package 410, and the package 410 is connected to the substrate 490 via the connector 450. The package 410 is, for example, a ceramic package, and stacked interconnects (10 layers of interconnects, for example) are provided in the package 410. Here, the package 410 may be a printed wiring board and the like, other than the ceramic, and a base material is not limited as long as it is possible to form a multilayer interconnection board (substrate).

The substrate 490 is, for example, a flexible printed wiring board. A sensor interconnect. $P_S$, a drive interconnect $P_D$ and a GND interconnect $P_G$, which will be described later, are drawn from the optical scanner apparatus 30 into the package 410, and further drawn in the substrate 490.

As described above, when controlling an oscillating angle of the mirror 310, the system controller 11 uses sensor signals obtained by the horizontal displacement sensor 391 and the vertical displacement sensors 395 and 396. Further, these sensor signals are used for controlling timing for emitting laser and ringing, detecting failures and the like, in addition to controlling the oscillating angle. It is important to accurately detect the sensor signals of the horizontal displacement sensor 391 and the vertical displacement sensors 395 and 396 in order to control them.

Sensor signals of the horizontal displacement sensor 391 and the vertical displacement sensors 395 and 396 are connected from the group of terminals TA and TB of the optical scanner apparatus 30 to a group of terminals TC and TD of the package 410. Then, the sensor signals pass through the stacked interconnects in the package 410, and further pass through the connector 450 and interconnects of the substrate 490 to reach a group of terminals TE. Further, similarly as the sensor signals, a horizontal driving signal and a vertical drive signal for driving the mirror 310 are connected from the group of terminals TA and TB of the optical scanner apparatus 30 to the group of terminals TE.

If an electrical cross-talk between interconnects occurs in the interconnects from the optical scanner apparatus 30 to the group of terminals TE, the sensor signals cannot be accurately detected. In particular, if cross-talk occurs between the horizontal driving signal and the horizontal displacement sensor 391, and between the vertical drive signal and the vertical displacement sensors 395 and 396, an original sensor output and a signal output due to the cross-talk are detected at the same time with the same waveform and the same frequency, from a sensor output.

Thus, even if the mirror 310 fails, and does not oscillate, as long as the interconnect is electrically connected, there is a rick that a defect will be generated, such as a sensor output is detected. In particular, as a plurality of interconnects are three-dimensionally provided in the package 410 including the stacked interconnects, and an electrical cross-talk is easily generated, a countermeasure to prevent generation of an electrical cross-talk is necessary.

The above described electrical cross-talk strongly depends on mutual capacitance and mutual inductance between interconnects.

A cross-talk by mutual capacitance is a phenomenon in which adjacent interconnects become a capacitor when having capacitance, and if one of the interconnects is electrically charged, electrical charge is induced even through lines are directly connected, and the other of the interconnects is also electrically charged. In such a case, the magnitude of the cross-talk is determined by the mutual capacitance and input voltage applied to the interconnects. Thus, according to the embodiment, in order to suppress (reduce) the cross-talk by the mutual capacitance, the following countermeasure is taken for the stacked interconnects of the package 410.

Figure 4:
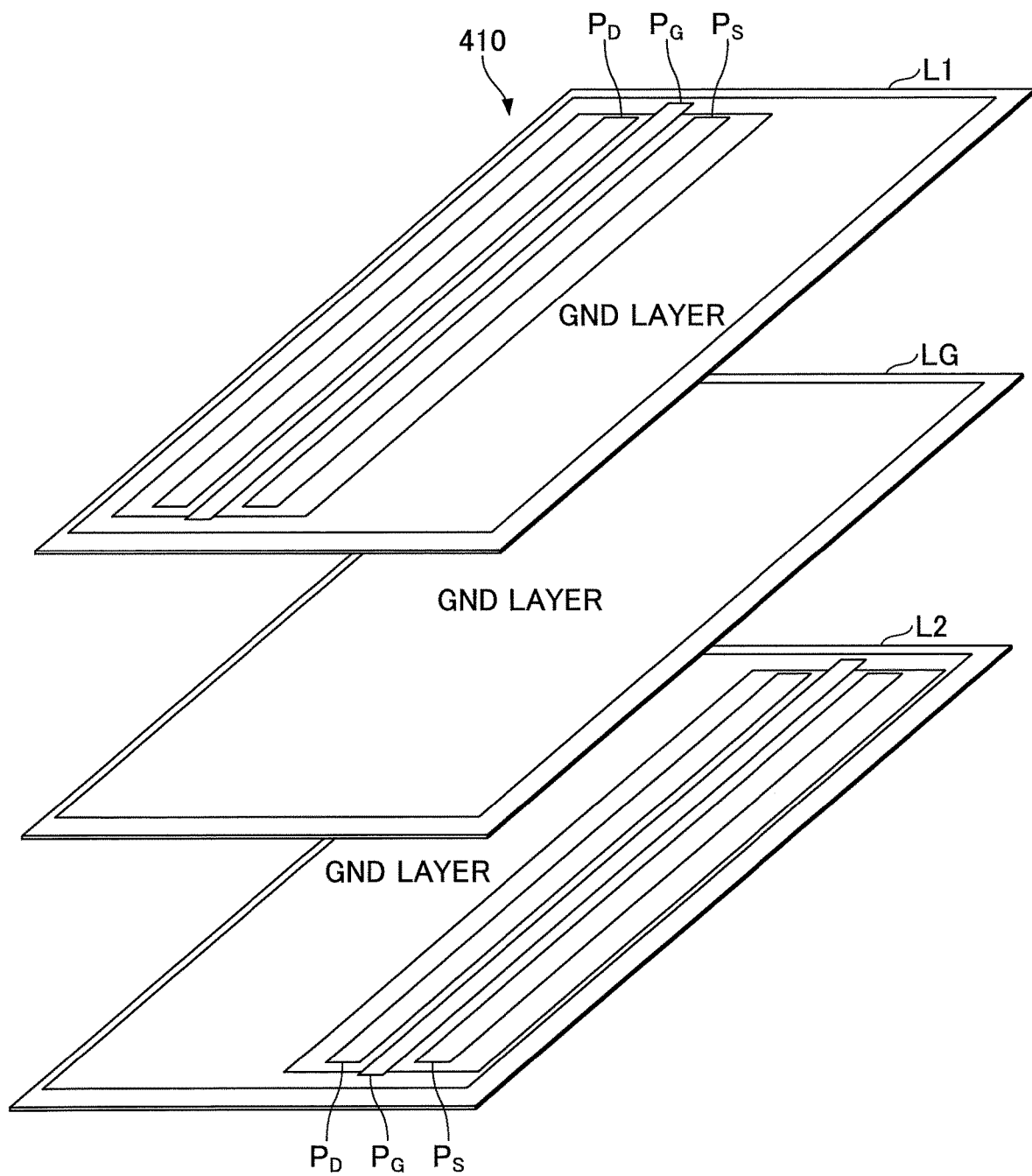
FIG. 4 is a view (No. 1) for describing a method of suppressing cross-talk.

Specifically, as illustrated in FIG. 4, in each layer of the stacked interconnects, a GND interconnect $P_G$ is provided to be sandwiched between an interconnect $P_S$ and an interconnect $P_D$. Further, a GND surface (GND layer) are provided around the interconnect $P_S$ and the interconnect $P_D$. With this, capacitance is hardly formed between the interconnect $P_S$ and the interconnect $P_D$. Here, in FIG. 4, the interconnect $P_S$ is a sensor interconnect that is connected to the displacement sensor, and the interconnect $P_D$ is a drive interconnect through which a drive signal for oscillating the mirror 310 passes (the same in the following).

Further, in each layer of the stacked interconnects, it is preferable that a GND layer LG including a GND surface whose entire surface is grounded is sandwiched between interconnect layers L1 and L2 in each of which the interconnect $P_S$ and the interconnect $P_D$ are formed. This means that it is preferable that a GND is sandwiched between interconnects in the vertical direction not only in a planar direction of the interconnects. With this, each of the interconnect $P_S$ and the interconnect $P_D$ is surrounded by the GND interconnect $P_G$ provided between the interconnects and the GND surface provided at the lower GND layer LG, and capacitance is hardly generated. Although the it is exemplified that the entire surface of the GND layer LG is formed as a GND layer, the GND interconnect $P_G$ may be provided right below each of the interconnects of the interconnect layers L1 and L2 along each of the interconnects $P_S$ and $P_D$. This means that the GND interconnect $P_G$ may be linearly provided, not as a plane.

A cross-talk by mutual inductance is a phenomenon in which a magnetic field is generated by electromagnetic induction when a current flowing through each of the interconnects varies in accordance with time, and an electromotive force is generated by the magnetic field. In such a case, the magnitude of the cross-talk is determined by variability of current with time and an amount of the current. Thus, according to the embodiment, in order to suppress (reduce) the cross-talk by the mutual inductance, the following countermeasure is taken for the stacked interconnects of the package 410.

Specifically, as illustrated in a plan view of FIG. 5A, in each layer of the stacked interconnects, the interconnect $P_S$ provided at a certain layer and the interconnect $P_D$ provided at a layer that is adjacent to the interconnect $P_S$ at an upper side or a lower side are provided not to overlap in a plan view. A distance L when the interconnect $P_S$ and the interconnect $P_D$ are seen in a plan view, is at least greater than or equal to a width of an interconnect (greater than or equal to 0.05 mm, for example), and it is preferable that the distance L is as large as possible.

Here, the interconnect $P_S$ provided at the certain layer and the interconnect $P_D$ provided at the layer that is adjacent to the interconnect $P_S$ at the upper side or the lower side may be provided such that portions extending in substantially the same direction are not overlapped in a plan view. However, the interconnect $P_S$ and the interconnect $P_D$ may have portions that are partially overlapping with each other in a plan view. FIG. 5B illustrates such an example. The interconnect $P_S$ and the interconnect $P_D$ illustrated in FIG. 5B are provided such that portions extending substantially in the same direction (portions laterally extending in the drawing) are not overlapped with each other in a plan view. However, the interconnects include portions that are crossing in a plan view.

As such, as illustrated by a plan view of FIG. 5B, when the interconnects (the interconnect $P_S$ and the interconnect $P_D$) are crossing with each other, it is preferable that a crossing angle is not an acute angle and the interconnects are crossing in a perpendicular direction as much as possible. This is to reduce generation of electromotive force by electromagnetic induction. Further, when the interconnect $P_S$ and the interconnect $P_D$ are provided in the same layer, it is preferable that the interconnect $P_S$ and the interconnect $P_D$ are not in parallel. Further, even when the interconnect $P_S$ and the interconnect $P_D$ are provided in different layers, it is preferable that the interconnect $P_S$ and the interconnect $P_D$ are not in parallel.

Although the stacked interconnects of the package 410 are described with reference to FIG. 4, FIG. 5A and FIG. 5B, it is preferable that the same counter measures are taken for the interconnects of the substrate 490. This is to furthermore reduce the cross-talk.

(Study on Cross-talk)

Next, suppression of the cross-talk described above with reference to FIG. 3 to FIG. 5B was studied. Here, the horizontal sensor signal is referred to as "H_SENS", the vertical sensor signal is referred to as "V_SENS" the horizontal driving signal is referred to as "H_DRV" and the vertical drive signal is referred to as "V_DRV".

Specifically, simulations of the mutual capacitance and the mutual inductance between H_DRV and H_SENS, between H_DRV and V_SENS, between V_DRV and H_SENS, and between V_DRV and V_SENS were conducted. Results are illustrated in Table 1 and Table 2.

Here, interconnects are designed in consideration of FIG. 4, FIG. 5A and FIG. 5B in the package 410, but interconnects are not designed in consideration of FIG. 4, FIG. 5A and FIG. 5B in a conventional package (this is the same in the following). This means that a GND is not provided between interconnects in each layer, or between layers in the vertical direction, and a portion at which interconnects in the vertical direction are overlapped or a portion at which the interconnects in the vertical direction are crossing in an acute angle are included, in the conventional package.

TABLE 1

MUTUAL CAPACITANCE SIMULATION VALUE

|  | CONVENTIONAL PACKAGE | | PACKAGE 400 | |
| --- | --- | --- | --- | --- |
| UNIT [pF] | H_DRV | V_DRV | H_DRV | V_DRV |
| H_SENS | 1.31 | 7.72 | 0.07 | 0.02 |
| V_SENS | 0.47 | 9.17 | 0.01 | 0.13 |

TABLE 2

MUTUAL INDUCTANCE SIMULATION VALUE

|  | CONVENTIONAL PACKAGE | | PACKAGE 400 | |
| --- | --- | --- | --- | --- |
| UNIT [nH] | H_DRV | V_DRV | H_DRV | V_DRV |
| H_SENS | 0.80 | 0.90 | 0.78 | 0.74 |
| V_SENS | 0.85 | 1.07 | 0.71 | 0.87 |

As illustrated in Table 1 and Table 2, it can be understood that the mutual capacitance and the mutual inductance are reduced in the package 410 compared with the conventional package. In particular, the mutual capacitance is largely reduced.

Figure 6:
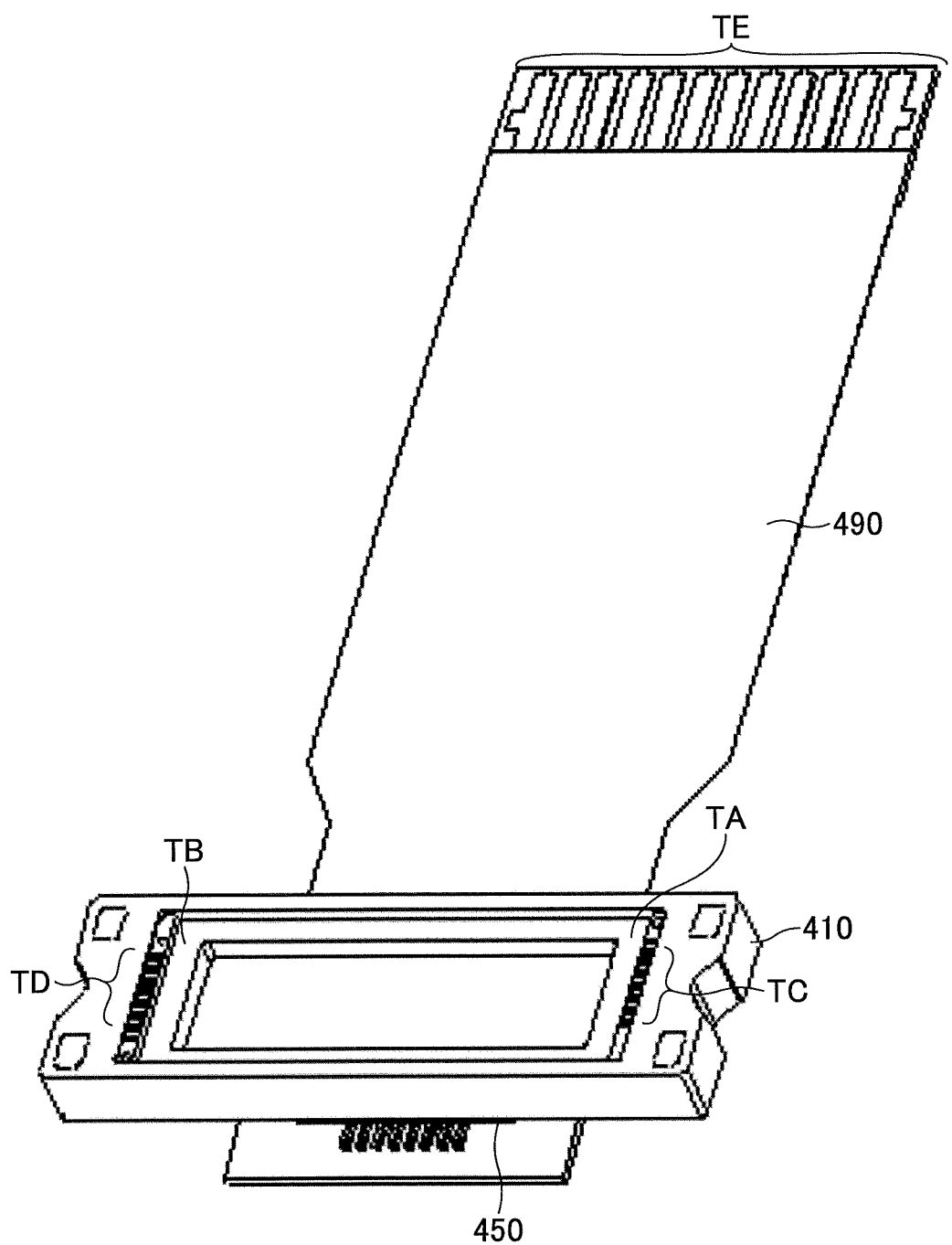
FIG. 6 is a view (No. 1) for describing an actual measurement of cross-talk.

Next, under a status that the optical scanner apparatus 30 was not mounted on the package 410 as illustrated in FIG. 6, cross-talk to the H_SENS when applying predetermined voltage on the H_DRV, and cross-talk to the V_SENS when applying predetermined voltage on the V_DRV were actually measured. Results are illustrated in Table 3.

TABLE 3

| VOLTAGE APPLIED TERMINAL | CROSS-TALK MEASUREMENT TERMINAL | CONVENTIONAL PACKAGE | PACKAGE 400 | IMPROVED EFFECT |
|---|---|---|---|---|
| H_DRV | H_SENS | 80 mV | 20 mV | −75% |
| V_DRV | V_SENS | 1,200 mV | 200 mV | −84% |

As illustrated in Table 3, it was confirmed that the cross-talk was improved for 75% at the horizontal side and 84% at the vertical in the package 410 compared with the conventional package.

Figure 7A:
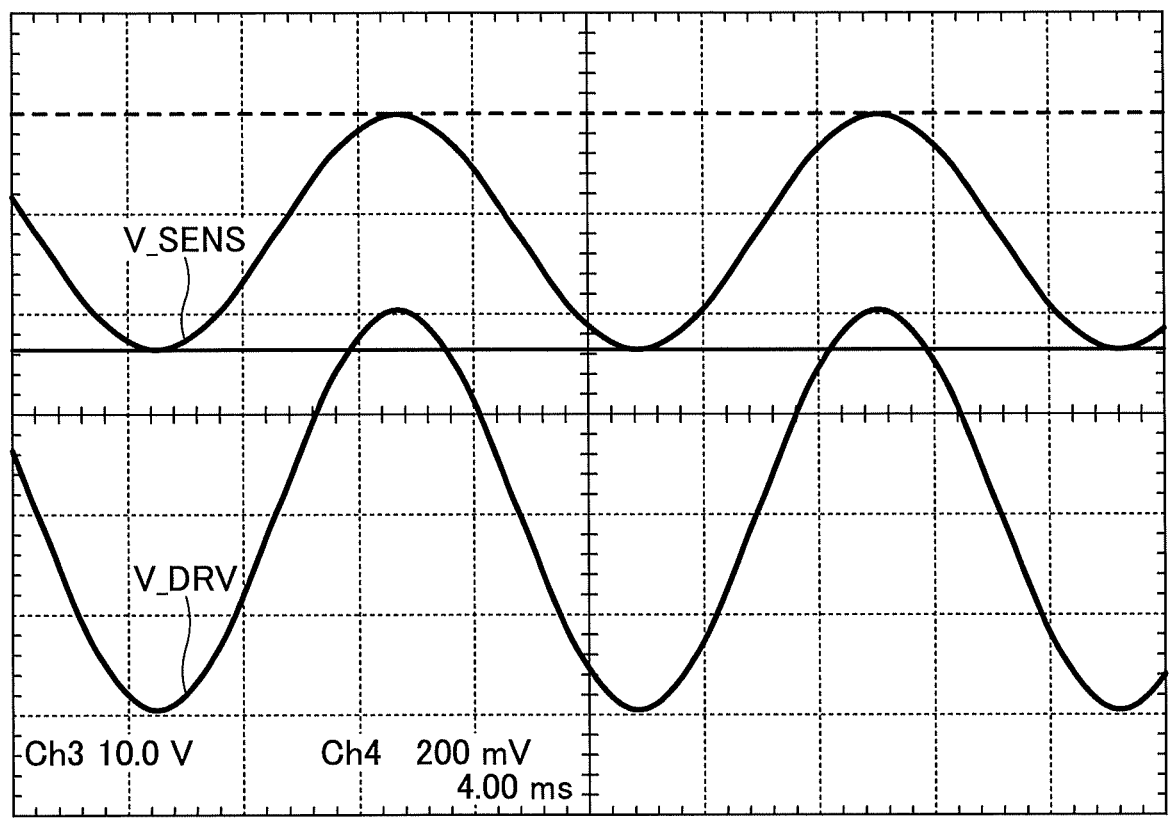
FIG. 7A is a view (No. 2) for describing an actual measurement of cross-talk.
Figure 7B:
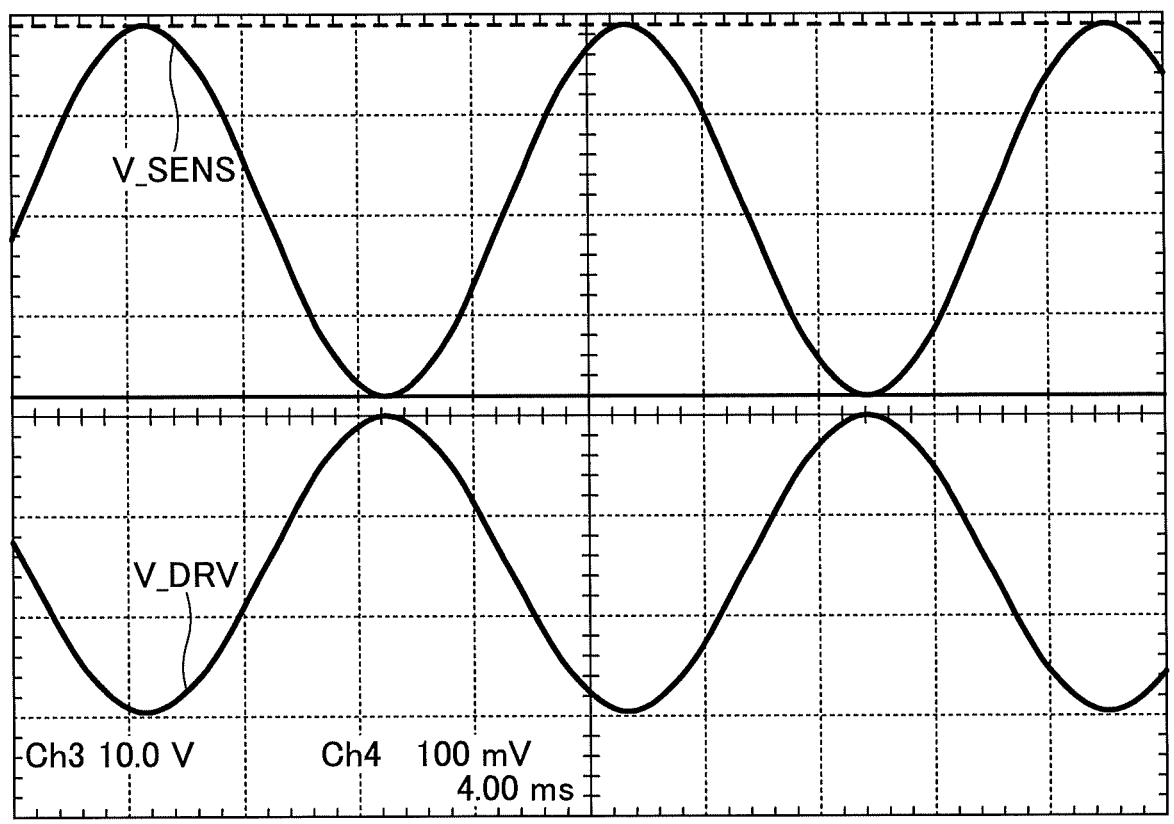
FIG. 7B is a view (No. 3) for describing an actual measurement of cross-talk.

Next, under a status that the optical scanner apparatus 30 was mounted on the package 410 as illustrated in FIG. 3, cross-talk to the H_SENS when applying predetermined voltage on the H_DRV, and cross-talk to the V_SENS when applying predetermined voltage on the V_DRV were actually measured. Results are illustrated in FIG. 7A and FIG. 7B. FIG. 7A illustrates the results of the conventional package, and FIG. 7B illustrates the results of the package 410.

As illustrated in FIG. 7A, the waveform of the V_SENS is the same as the waveform of the V_DRV in the conventional package. According to the structure of the optical scanner apparatus 30, originally, phases of the waveform of the V_SENS and the waveform of the V_DRV should be reversed 180 degrees, however, as the cross-talk from the V_DRV to the V_SENS is large, they became the same phase.

On the other hand, as illustrated in FIG. 7B, it can be understood that phases of the waveform of the V_SENS and the waveform of the V_DRV package 410 were reversed 180 degrees in accordance with a theory, and an original sensor waveform that reflected a driving status of the mirror 310 was output to the caV_SENS.

As such, in the optical scanner module 400, when the sensor interconnect and the drive interconnect are stacked, the sensor interconnect and the drive interconnect are placed not to overlap with each other in a plan view. Further, when the sensor interconnect and the drive interconnect are formed in a same layer, a GND interconnect is provided between the adjacent sensor interconnect and the drive interconnect. With this configuration, cross-talk generated between the sensor interconnect and the drive interconnect can be reduced, and a signal from the sensor interconnect can be accurately detected.

Further, in the optical scanner module 400, when the sensor interconnect and the drive interconnect are stacked, it is preferable that a GND interconnect is provided between the sensor interconnect and the drive interconnect that are adjacent in the upper and lower direction. Further, when the sensor interconnect and the drive interconnect that are adjacent in the upper and lower direction are crossing with each other, it is preferable that they are placed such that to perpendicularly cross with each other. With this configuration, cross-talk generated between the sensor interconnect and the drive interconnect can be furthermore reduced, and a signal from the sensor interconnect can be furthermore accurately detected.

(Second Embodiment)

In a second embodiment, an example in which the GND is strengthened is described. Here, the same components that are already described in the above embodiment may not be repeated.

Figure 8:
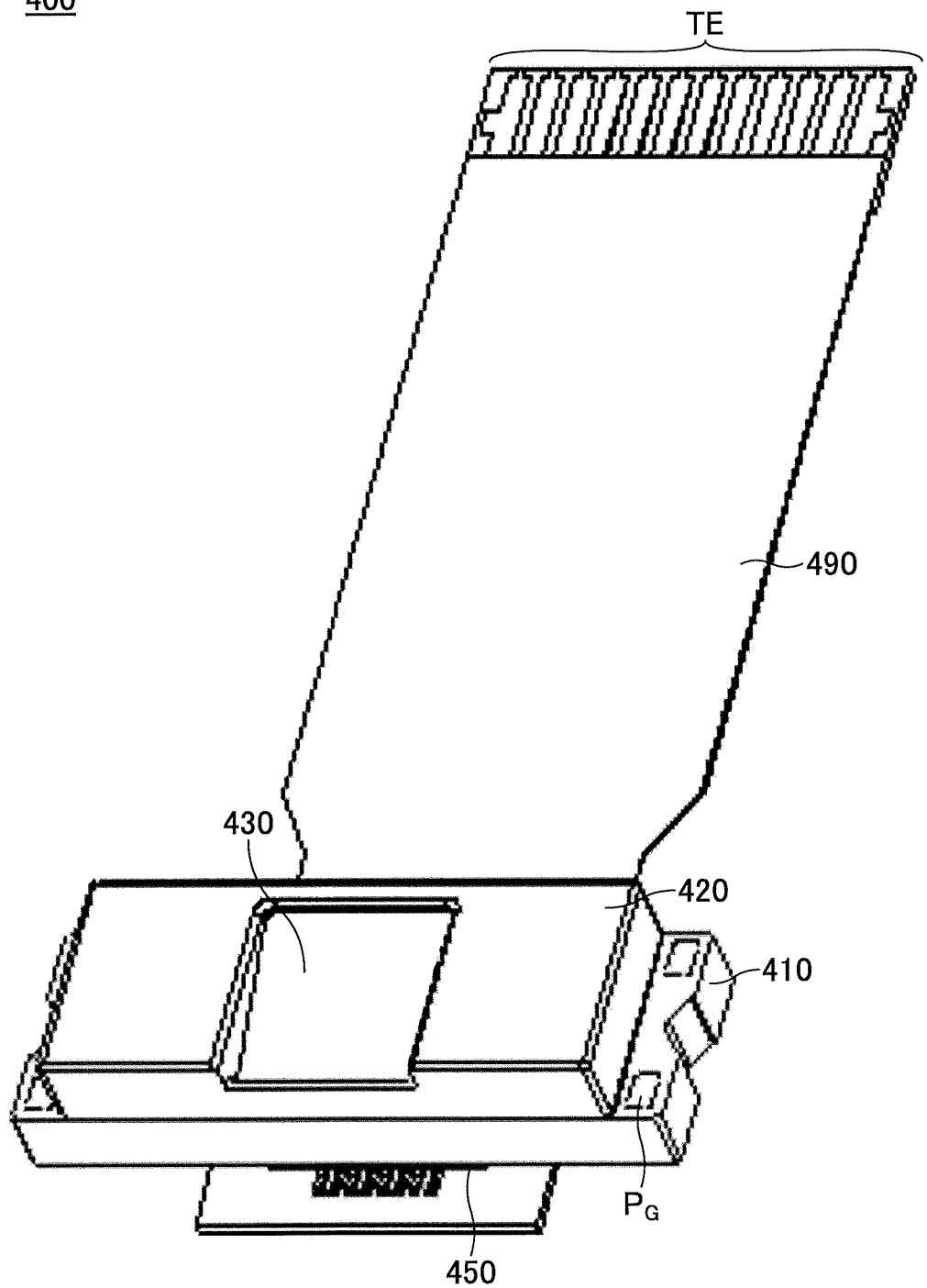
FIG. 8 is a perspective view (No. 1) for describing GND strengthening of a package.

FIG. 8 is a perspective view (No. 1) for describing strengthening the GND of the package. As illustrated in FIG. 8, the package cover 420 is provided on the package 410 so as to cover the optical scanner apparatus 30 in the optical scanner module 400. Here, as the optical scanner apparatus. 30 is covered by the package cover 420, the optical scanner apparatus 30 cannot be seen in FIG. 8.

An opening is provided at a substantially center portion of the package cover 420 that exposes a vicinity of the mirror 310 of the optical scanner apparatus 30, and the cover glass 430 that transmits incident light and output light is provided so as to cover the opening.

Further, GND interconnects $P_G$ are provided at an outer edge portion of a surface of the package 410 at which the optical scanner apparatus 30 is mounted and at a position that is exposed from the package cover 420 to be externally connected. Each of the GND interconnects $P_G$ is drawn from the GND interconnect in the package 410 to the surface of the package 410. The number of the GND interconnect $P_G$ may be one or plural. As an example, the GND interconnect $P_G$ is provided at each of four corners of the surface of the package 410 at which the optical scanner apparatus 30 is mounted.

Figure 9A:
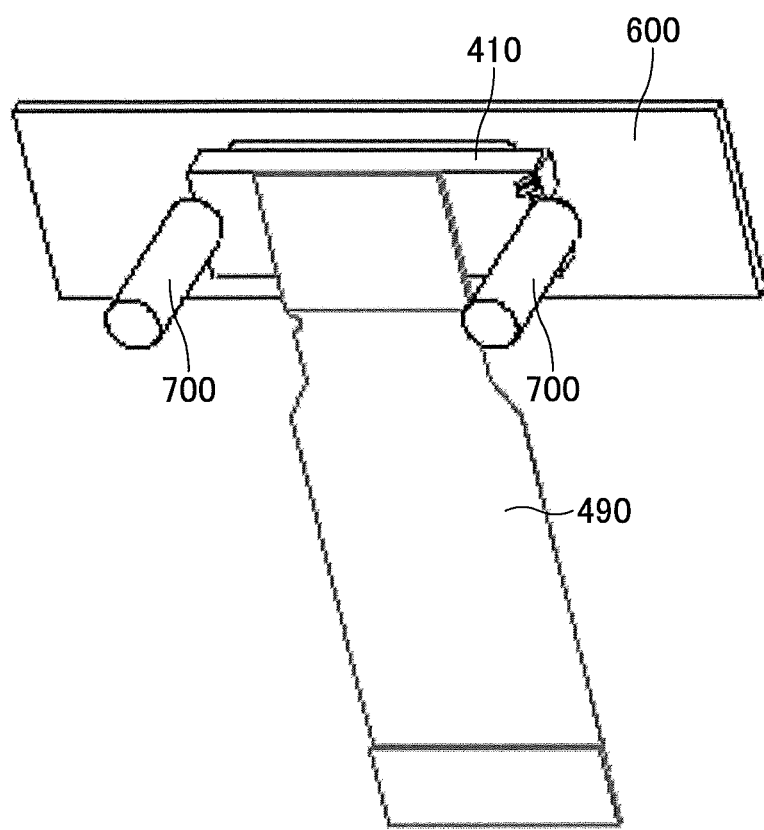
FIG. 9A is a perspective view (No. 2) for describing GND strengthening of a package.
Figure 9B:
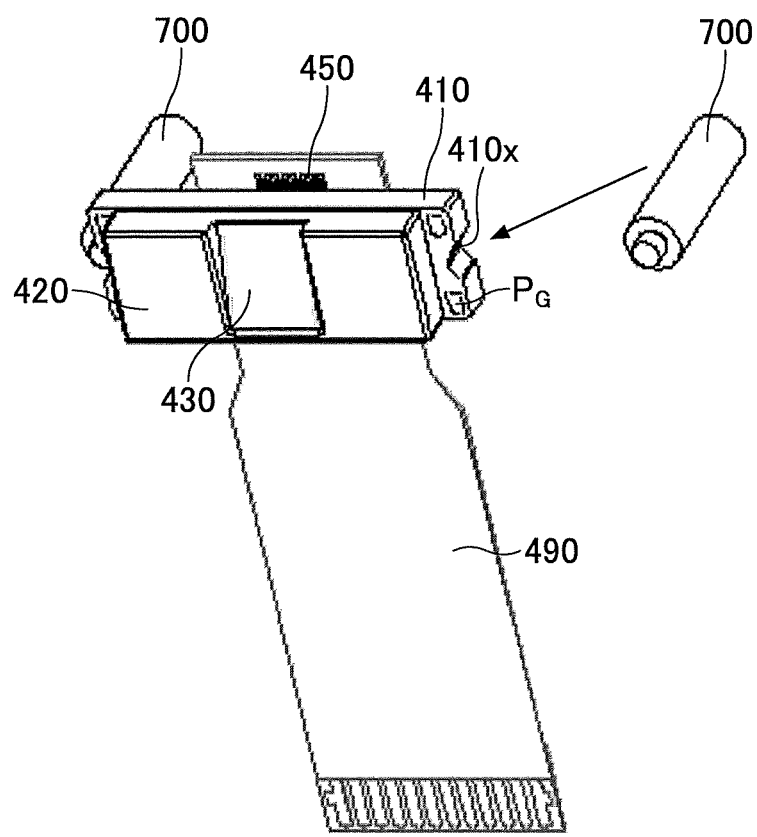
FIG. 9B is a perspective view (No. 3) for describing GND strengthening of a package.

FIG. 9A and FIG. 9B are perspective views (No. 2) for describing strengthening the GND of the package. As illustrated in FIG. 9A, the package 410 is fixed to a housing 600 while facing a GND interconnect $P_G$ side to the housing 600 by hold pins 700 (fixing member). The package cover 420 including the cover glass 430 is exposed at an opposite surface of the housing 600 from an opening provided in the housing 600, and light can be input into and output from the optical scanner apparatus 30.

FIG. 9B illustrates a status in which the package 410 is attached to the housing 600 (not illustrated in FIG. 9B). As illustrated in FIG. 9B, each of the hold pins 700 has a structure in which a cylindrical portion with a small diameter is substantially concentrically provided at a front end of a cylindrical portion with a large diameter.

While pressing and contacting the package 410 to the housing 600, a side surface of the cylindrical portion with a large diameter of each of the hold pins 700 is contacted at a groove 410x having a substantially V shape provided at a side surface of the package 410, and the cylindrical portion with a small diameter is inserted in a hole provided in the housing 600 to fix the respective hold pin 700. At this time, by forming the hole to be larger, and laterally moving the hold pin 700, a position of the package 410 with respect to the housing 600 can be adjusted (in other words, a position of the mirror 310 can be adjusted).

The housing 600 is made of a metal or an insulating body whose surface is coated by a metal, and is grounded. When attaching the package 410 to the housing 600, the GND interconnect $P_G$ and the surface of the housing 600 are physically contacted, and both (both GNDs) are electrically connected. As the housing 600 is a stable GND, the GND interconnect $P_G$ and the GND in the package 400 connected to the GND interconnect $P_G$ are strengthened. Thus, by strengthening the GND as described in the second embodiment, in addition to the method of suppressing the cross-talk by the mutual capacitance described in the first embodiment, the cross-talk by the mutual capacitance can be furthermore suppressed.

Figure 10A:
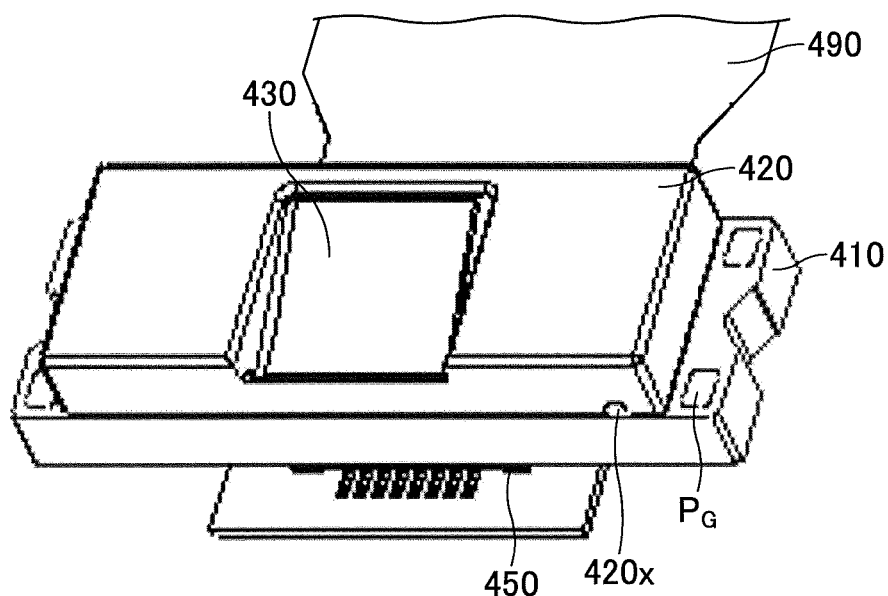
FIG. 10A is a view for describing a vent provided at a package cover.
Figure 10B:
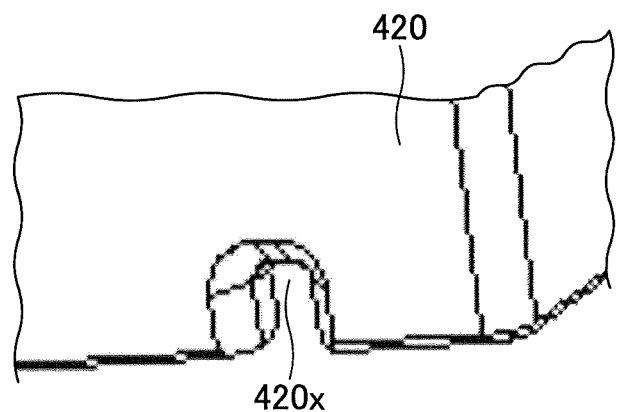
FIG. 10B is a view for describing the vent provided at the package cover.

As illustrated in FIG. 10A, a vent 420x is provided in the package cover 420, and ultraviolet curing resin or the like is filled in the vent 420x to block the vent 420x. FIG. 10B illustrates the vent 420x in an enlarged manner before the vent 420x is filled with the ultraviolet curing resin or the like. The reason for providing the vent 420x is as follows.

The structure of FIG. 10A may be manufactured by, for example, after bonding the cover glass 430 to the package cover 420, curing the package cover 420 including the cover glass 430 to the package 410 by a heat curing adhesive agent.

However, when curing the heat curing adhesive agent, gas in a sealed space sealed by the package cover 420 including the cover glass 430 and the package 410 may expand and the adhesive agent may be cured while the package cover 420 is floated.

If the adhesive agent is cured while the package cover 420 is floated, the sealed space cannot be sealed and dusts in air enter the sealed space. At this time, as the mirror 310 is driven at high-speed, the dusts in air may collide against a surface of the mirror 310 and the mirror 310 may be contaminated. In order to prevent such contamination, it is necessary to seal with clean gas.

Thus, the vent 420x is provided at the package cover 420. With this configuration, when curing the heat curing adhesive agent, the expanded gas in the sealed space can be released from the vent 420x. Then, after the heat curing adhesive agent is cured, by blocking the vent 420x by ultraviolet curing resin or the like at ambient temperature again, the sealed space can be surely sealed without the package cover 420 being floated.

Although preferred embodiments have been specifically illustrated and described, it is to be understood that minor modifications may be made therein without departing from the spirit and scope of the invention as defined by the claims.

For example, an example is described in the above embodiments in which the optical scanner control apparatus of the invention is applied to the laser scanning projector. However, this is just an example, and the optical scanner control apparatus of the invention may be applied to various devices for displaying an image on a screen. For such devices, for example, an on-vehicle head up display, a head mount display, a laser printer, a laser scanning epilator, a laser head lamp, a laser radar or the like may be exemplified.

The present application is based on and claims the benefit of priority of Japanese Priority Application No. 2015-196872 filed on Oct. 2, 2015, the entire contents of which are hereby incorporated by reference.

1 optical scanner control apparatus
10 circuit unit
11 system controller
12 CPU
13 buffer circuit
14 mirror driving circuit
15 laser driving circuit
16 temperature control circuit
20 light source unit
21 LD module
22 temperature control unit
23 temperature sensor
24 beam attenuating filter
30 optical scanner apparatus
40 optical unit
50 screen
60 light quantity detection sensor
211R, 211G, 211B laser
215 light quantity detection sensor
310 mirror
320 mirror support portion
322 slit
330A, 330B torsion beam
340A, 340B connecting beam
350A, 350B, 370A, 370B driving beam
351A, 351B, 371R, 371L driving source
360 movable frame
380 fixed frame
391 horizontal displacement sensor
392, 393, 394 dummy sensor
395, 396 vertical displacement sensor
400 optical scanner module
410 package
410x groove
420 package cover
420x vent
430 cover glass
450 connector
490 substrate
600 housing
700 hold pin

What is claimed is:

1. An optical scanner module, comprising:
an optical scanner apparatus that scans incident light by oscillating a mirror;
a package on which the optical scanner apparatus is mounted, the package formed by a multilayer interconnection board,
wherein the optical scanner apparatus includes
a displacement sensor that detects an oscillation angle of the mirror, and
a first group of terminals that are respectively connected to a sensor interconnect connected to the displacement sensor and a drive interconnect through which a drive signal for oscillating the mirror passes,
wherein the package includes
a second group of terminals that are connected to the first group of terminals of the optical scanner apparatus, and
stacked interconnects, in which the sensor interconnect and the drive interconnect are formed, the stacked interconnects extended from the optical scanner apparatus by a connection between the first group of terminals and the second group of terminals, and
wherein portions of the sensor interconnect and the drive interconnect in the stacked interconnects are placed not to overlap in a plan view, the portions extending in substantially the same direction in the package, and
a ground (GND) interconnect is provided between the sensor interconnect and the drive interconnect that are adjacent in a same interconnect layer in the package.

2. The optical scanner module according to claim 1, wherein a GND layer is provided between interconnect layers.

3. The optical scanner module according to claim 1, wherein a GND interconnect is provided at upper or lower of each of the interconnect layers to extend along each of the sensor interconnect and the drive interconnect.

4. The optical scanner module according to claim 1, wherein when the sensor interconnect and the drive interconnect that are adjacent in an upper and lower direction are crossing with each other, the sensor interconnect and the drive interconnect are provided to perpendicular to each other.

5. The optical scanner module according to claim 1, wherein the GND interconnect is extended from inside of the package to a surface of the package to be exposed at the surface, and is configured to be externally connectable.

6. An optical scanner control apparatus comprising:
the optical scanner module of claim 1;
a control unit that generates the drive signal based on a signal obtained via the sensor interconnect; and
a driving circuit that drives the mirror based on the drive signal generated by the control unit.

7. The optical scanner module according to claim 1, wherein the sensor interconnect, the drive interconnect, and the GND interconnect, which are extended in the package, are electrically connected to a substrate via a connector.

* * * * *

UNITED STATES PATENT AND TRADEMARK OFFICE
CERTIFICATE OF CORRECTION

| | |
|---|---|
| PATENT NO. | : 10,654,708 B2 |
| APPLICATION NO. | : 15/763921 |
| DATED | : May 19, 2020 |
| INVENTOR(S) | : Tsukasa Yamada, Takahiro Wakasugi and Shinobu Kasahara |

It is certified that error appears in the above-identified patent and that said Letters Patent is hereby corrected as shown below:

On the Title Page

Please correct Item (71) Name of Applicants:
"MITSUMI ELECTRIC CO., LTD., Tokyo (JP); Tsukasa Yamada, Tokyo (JP); Takahiro Wakasugi, Tokyo (JP); Shinobu Kasahara, Tokyo (JP)"
To:
"Tsukasa Yamada, Tokyo (JP); Takahiro Wakasugi, Tokyo (JP); Shinobu Kasahara, Tokyo (JP)".

Signed and Sealed this
Tenth Day of November, 2020

Andrei Iancu
*Director of the United States Patent and Trademark Office*